US010892357B2

(12) United States Patent
Iucolano et al.

(10) Patent No.: US 10,892,357 B2
(45) Date of Patent: *Jan. 12, 2021

(54) DOUBLE-CHANNEL HEMT DEVICE AND MANUFACTURING METHOD THEREOF

(71) Applicant: STMICROELECTRONICS S.R.L., Agrate Brianza (IT)

(72) Inventors: Ferdinando Iucolano, Gravina di Catania (IT); Alessandro Chini, Modena (IT)

(73) Assignee: STMICROELECTRONICS S.r.l., Agrate Brianza (IT)

( * ) Notice: Subject to any disclaimer, the term of this patent is extended or adjusted under 35 U.S.C. 154(b) by 0 days.

This patent is subject to a terminal disclaimer.

(21) Appl. No.: 16/431,642

(22) Filed: Jun. 4, 2019

(65) Prior Publication Data

US 2019/0288100 A1 Sep. 19, 2019

Related U.S. Application Data

(63) Continuation of application No. 15/393,945, filed on Dec. 29, 2016, now Pat. No. 10,381,470.

(30) Foreign Application Priority Data

May 30, 2016 (EP) ..................... 16425047

(51) Int. Cl.
*H01L 29/778* (2006.01)
*H01L 29/66* (2006.01)
(Continued)

(52) U.S. Cl.
CPC ...... *H01L 29/7787* (2013.01); *H01L 21/0254* (2013.01); *H01L 21/02458* (2013.01);
(Continued)

(58) Field of Classification Search
None
See application file for complete search history.

(56) References Cited

U.S. PATENT DOCUMENTS 6,274,893 B1 8/2001 Igarashi et al.
6,521,961 B1 2/2003 Costa et al.
(Continued)

FOREIGN PATENT DOCUMENTS

CN 102130158 A 7/2011
CN 102629624 A 8/2012
(Continued)

OTHER PUBLICATIONS

Bisi et al., "Kinetics of Buffer-Related $R_{ON}$—Increase in GaN-on-Silicon MIS-HEMTs," *IEEE Electron Device Letters* 35(10): 1004-1006, 2014.
(Continued)

*Primary Examiner* — Khaja Ahmad
(74) *Attorney, Agent, or Firm* — Seed IP Law Group LLP

(57) ABSTRACT

An HEMT device, comprising: a semiconductor body including a heterojunction structure; a dielectric layer on the semiconductor body; a gate electrode; a drain electrode, facing a first side of the gate electrode; and a source electrode, facing a second side opposite to the first side of the gate electrode; an auxiliary channel layer, which extends over the heterojunction structure between the gate electrode and the drain electrode, in electrical contact with the drain electrode and at a distance from the gate electrode, and forming an additional conductive path for charge carriers that flow between the source electrode and the drain electrode.

20 Claims, 6 Drawing Sheets

(51) Int. Cl.

| | |
|---|---|
| H01L 29/06 | (2006.01) |
| H01L 21/02 | (2006.01) |
| H01L 29/20 | (2006.01) |
| H01L 29/205 | (2006.01) |
| H01L 29/40 | (2006.01) |
| H01L 29/417 | (2006.01) |
| H01L 29/423 | (2006.01) |

(52) U.S. Cl.
CPC ...... *H01L 29/0657* (2013.01); *H01L 29/2003* (2013.01); *H01L 29/205* (2013.01); *H01L 29/402* (2013.01); *H01L 29/66462* (2013.01); *H01L 29/7786* (2013.01); *H01L 29/41766* (2013.01); *H01L 29/4236* (2013.01); *H01L 29/42376* (2013.01)

(56) References Cited

U.S. PATENT DOCUMENTS

| | | | |
|---|---|---|---|
| 9,419,121 B1* | 8/2016 | Teo | H01L 29/41758 |
| 2007/0278518 A1 | 12/2007 | Chen et al. | |
| 2014/0159116 A1* | 6/2014 | Briere | H01L 29/402 |
| | | | 257/194 |
| 2017/0092752 A1* | 3/2017 | Lu | H01L 29/66462 |

FOREIGN PATENT DOCUMENTS

| | | |
|---|---|---|
| CN | 102637726 A | 8/2012 |
| CN | 102683406 A | 9/2012 |
| JP | 2001-127282 A | 5/2020 |

OTHER PUBLICATIONS

Chevtchenko et al., "Off-state breakdown and dispersion optimization in AlGaN/GaN heterojunction field-effect transistors utilizing carbon doped buffer," *Applied Physics Letters 100*:223502, 3 pages, 2012.

Hilt et al., "Normally-off GaN Transistors for Power Applications," *Journal of Physics: Conference Series 494*:012001, 6 pages, 2014.

Hwang et al., "Impact of Channel Hot Electrons on Current Collapse in AlGaN/GaN HEMT's,"*IEEE Electron Device Letters 31*(12): 1494-1496, 2013.

Jin et al., "Total current collapse in High-Voltage GaN MIS-HEMTs induced by Zener trapping," IEEE, Microsystems Technology Laboratories, Massachusetts Institute of Technology, pp. 6.2.1-6.2.4, 2013.

Lin, "Market and Technology Trends in WBG Materials for Power Electronics Applications," CS Mantech Conference, May 18-21, 2015, Scottsdale, Arizona, USA pp. 33-36.

Moens et al., "On the Impact of Carbon-Doping on the Dynamic Ron and Off-state Leakage Current of 650V GaN Power Devices" 2015 IEEE 27th International Symposium on Power Semiconductor Devices & IC's (ISPSD), 2015, 4 pages.

Würfl et al., "Techniques towards GaN power transistors with improved high voltage dynamic switching properties," *IEDM13-147* pp. 6.1.1-6.1.4, 2013.

\* cited by examiner

DOUBLE-CHANNEL HEMT DEVICE AND MANUFACTURING METHOD THEREOF

BACKGROUND

Technical Field

The present disclosure relates to an HEMT device and to a method for manufacturing the same.

Description of the Related Art

Known to the art are high-electron-mobility transistors (HEMTs) with heterostructure made, in particular, of gallium nitride (GaN) and aluminum gallium nitride (AlGaN). For example, HEMT devices are appreciated for use as power switches thanks to their high breakdown threshold. In addition, the high current density in the conductive channel of the HEMT enables a low ON-state resistance (RON) of the conductive channel.

In order to favor use of HEMTs in high-power applications, recessed-gate HEMTs have been introduced.

A problem with devices of this type regards the drastic reduction of current, due to an increase of the ON-state resistance (Rory), during switching operations. The temporary increase in the RON value after high-voltage biasing (400-600 V) in the OFF state is deemed to be caused by an excessive trapping of the charge carriers in the channel, in the buffer layer, or at the surface.

In order to reduce this problem, various solutions have been adopted.

The document by D. Jin et al., "Total current collapse in High-Voltage GaN MIS-HEMTs induced by Zener trapping", Microsystems Technology Laboratories, Massachusetts Institute of Technology, Cambridge, Mass., U.S.A., represents a method of control of defects during the stage of epitaxial growth of the channel and an appropriate design of the "field plate" structures. This method, however, does not solve the problem and requires a control of the growth stage, which has an impact on the costs of industrial production of HEMTs.

The document by P. Moens et al., "On the Impact of Carbon-Doping on the Dynamic Ron and Off-state Leakage Current of 650V GaN Power Devices", ON Semiconductor, suggests that the optimization of the doping profile with carbon atoms of the semiconductor body of the HEMT at the level of the buffer layer may provide a solution to the aforementioned problem. However, the presence itself of impurities such as carbon atoms may itself be the cause of further trapping of carriers and Rory degradation.

The document by J. Würfl et al., "Techniques towards GaN power transistors with improved high voltage dynamic switching properties", 2013, discusses the limitation of dynamic switching in a GaN power device and proposes techniques for improving fast switching at high voltage by modifying the structure of the buffer layer of an HEMT. The aforementioned problems, however, are not solved.

BRIEF SUMMARY

At least some embodiments of the present disclosure provide an HEMT device and a manufacturing method thereof that are alternative to the ones proposed according to the prior art, and that overcome the drawbacks set forth above.

According to at least one embodiment of the present disclosure, an HEMT device includes:

a semiconductor body including a heterojunction structure that forms a main conductive channel of the HEMT device;

a dielectric layer on the semiconductor body;

a gate electrode, a drain electrode, and a source electrode aligned with one another in a direction, wherein the drain electrode extends facing a first side of the gate electrode, and the source electrode extends facing a second side, opposite to the first side in said direction, of the gate electrode; and an auxiliary channel layer, which extends over the heterojunction structure between the gate electrode and the drain electrode, is in electrical contact with the drain electrode, is spaced apart from the gate electrode, and forms a conductive path additional to the main conductive channel for charge carriers that flow between the source electrode and the drain electrode.

BRIEF DESCRIPTION OF THE SEVERAL VIEWS OF THE DRAWINGS

For a better understanding of the present disclosure, preferred embodiments thereof are now described, purely by way of non-limiting example and with reference to the attached drawings, wherein.

DETAILED DESCRIPTION

Figure 1:
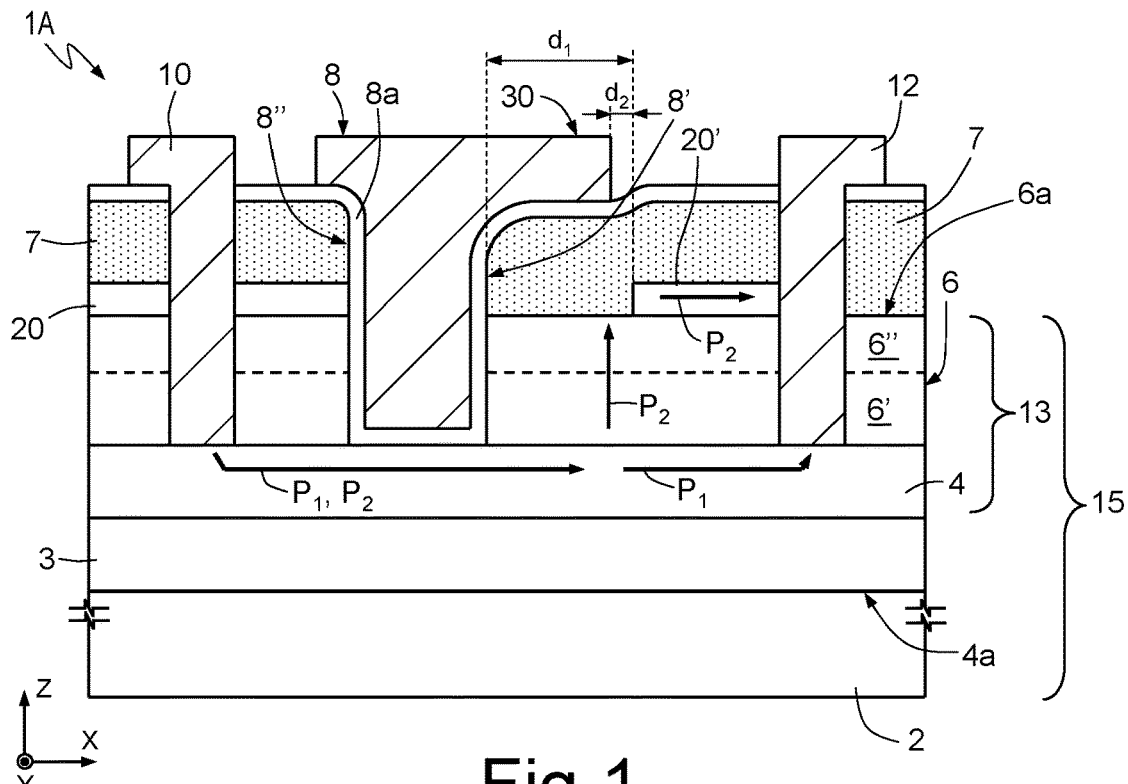
FIG. 1 shows, in lateral sectional view, an HEMT device according to one embodiment of the present disclosure.

FIG. 1 shows, in a triaxial system of axes X, Y, Z orthogonal to one another, an HEMT device 1A of a normally-off type, including a semiconductor substrate 2; a semiconductor buffer layer 3 which extends over the substrate 2 and is designed to enable a better depletion of the two-dimensional electron gas (2DEG) in the overlying conductive channel; a channel layer 4 which extends over the buffer layer 3; a semiconductor barrier layer 6 which extends over the channel layer 4; an insulation layer 7, of dielectric material such as silicon nitride ($Si_3N_4$) or silicon oxide ($SiO_2$), which extends over a front side 6a of the barrier layer 6; and a gate region 8, which extends in the semiconductor body 3 between a source electrode 10 and a drain electrode 12. In one or more embodiments, the substrate 2 is made, for example, of silicon, silicon carbide (SiC), or sapphire ($Al_2O_3$). In one or more embodiments, the buffer layer 3 is made of aluminum gallium nitride (AlGaN), indium gallium nitride (InGaN) or, in general, of AlGaN or InGaN alloys. In one or more embodiments, the channel layer 4 is made of gallium nitride (GaN) or intrinsic InGaN and has a thickness comprised between approximately 5 nm and 400 nm, e.g., approximately 15 nm. In one or more embodiments, the barrier layer 6 is made of intrinsic aluminum gallium nitride (AlGaN) or, more in general, of compounds based upon ternary or quaternary alloys of gallium nitride, such as AlxGa1−xN, AlInGaN, InxGa1−xN, AlxIn1−xAl, and has a thickness comprised between approximately 5 nm and 400 nm, e.g., approximately 15 nm.

The substrate 2, the buffer layer 3, the channel layer 4, the barrier layer 6, and the insulation layer 7 lie in respective planes parallel to the plane XY and are stacked on one another in the direction Z.

The channel layer 4 and the barrier layer 6 form a heterostructure 13. The substrate 2, the buffer layer 3, and the heterostructure 13 are defined, as a whole, by the term "semiconductor body 15".

The gate region 8 is separated and insulated laterally (i.e., along X) from the source region 10 and drain region 12 by respective portions of the insulation layer 7. The gate region 8 is of a recessed type; i.e., it extends in depth through the insulation layer 7 and completely through the barrier layer 6, as far as the channel layer 4.

In other words, the gate region 8 is formed in a trench 9 etched through the insulation layer 7 and the barrier layer 6.

A gate dielectric layer 8a extends in the trench 9 facing the bottom and the side walls of the trench 9. The gate dielectric 8a may further extend, optionally, outside of the trench 9, i.e., on the insulation layer 7. A gate metallization 8b completes filling of the trench 9 and extends over the gate dielectric layer 8a. The gate dielectric layer 8a and the gate metallization 8b form the gate region 8 of the HEMT device 1A.

The gate region 8 has a first side 8' facing the drain region 12 and a second side 8" facing the source region 10. The first and second sides 8', 8" of the gate region 8 extend, at least in part, parallel to one another and to the plane XY.

According to one aspect of the present disclosure, an auxiliary channel 20 extends over a front side 6a of the barrier layer 6 between, and electrically coupled to, the source region 10 and the drain region 12. In particular, the auxiliary channel 20 extends between the first side 8' of the gate region 8 and the drain region 12, and between the second side 8" of the gate region 8 and the source region 10. However, the portion of auxiliary channel that extends between the gate region 8 and the source region 10 may be absent.

In even greater detail, the auxiliary channel 20 extends between, and in contact with, a portion of the source region 10 and a respective portion of the gate oxide 8a that defines the second side 8" of the gate region 8, and further in direct contact with the drain region 12. However, the auxiliary channel 20 is not in direct contact with the first side 8' of the gate region 8, but at a distance therefrom. Thus, the auxiliary channel 20 extends in the proximity of the first side 8' without ever being in direct contact therewith. The auxiliary channel 20 extends at a distance $d_1$ (measured in the direction X) from the first side 8' of the gate region 8 chosen so that the electrical field is not excessively high on the first side 8'. An electrical field is considered too high if it causes, or may cause, breakdown of the gate dielectric.

The present applicant has found that values of the distance $d_1$ equal to, or greater than, 0.5 μm are sufficient to satisfy the aforementioned conditions for the choice of $d_1$.

According to one embodiment of the present disclosure, in the presence of a gate electrode or gate field plate 30, the auxiliary channel 20 extends laterally offset with respect to the metal layer that provides the field plate 30 by a maximum distance (measured along X) not greater than a value $d_2$. The value of distance $d_2$ is chosen so that there do not arise the problems, discussed with reference to the known art, of depletion of the two-dimensional electron gas (2DEG) and increase of the ON-state resistance as a result of the trapping phenomena. The exact choice of $d_2$ may be made experimentally, by experimental tests on a test device.

The present applicant has found that values of the distance $d_2$ equal to, or smaller than, 0.5 μm are such as to overcome the drawbacks of the known art.

The auxiliary channel 20, according to one embodiment, is made of gallium nitride (GaN) with an N-type doping, in particular with a density of dopant species comprised between $1·10^{18}$ cm$^{-3}$ and $1·10^{19}$ cm$^{-3}$, in particular $1·10^{18}$ cm$^{-3}$. In this case, the thickness of the auxiliary channel 20 is comprised between 5 nm and 100 nm, in particular 50 nm.

Figure 2:
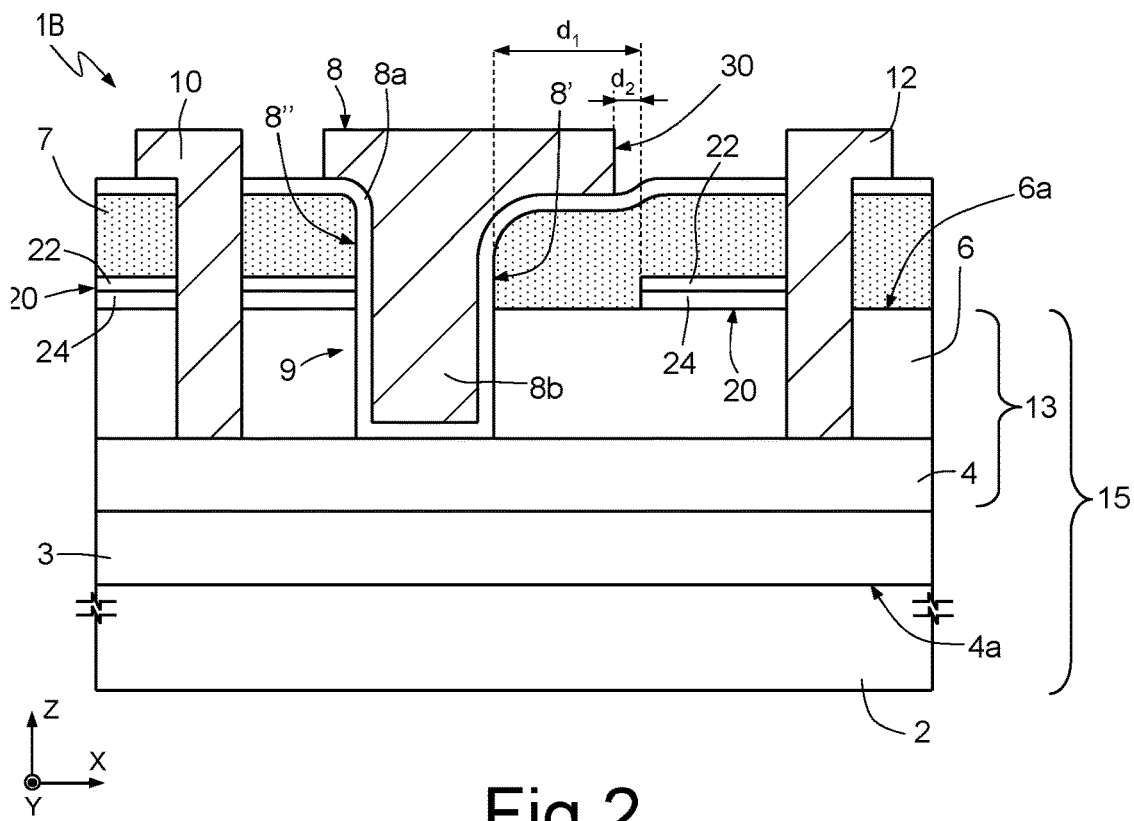
FIG. 2 shows, in lateral sectional view, an HEMT device according to a further embodiment of the present disclosure.

In an HEMT 1B according to an alternative embodiment, shown in detail in FIG. 2, the auxiliary channel 20 is a heterostructure including a layer of aluminum gallium nitride (AlGaN) 22 overlying a layer of gallium nitride (GaN) 24. The AlGaN layer 22 has a thickness comprised between 5 nm and 50 nm, with aluminum concentration comprised between 15% and 50% (for example, 25%); the GaN layer 24 has a thickness comprised between 2 nm and 50 nm, for example 8 nm.

With reference to the barrier layer 6, in both of the embodiments of FIGS. 1 and 2, it is preferably formed by two intermediate AlGaN layers 6', 6" having concentrations of aluminum different from one another. According to an aspect of the present disclosure, the concentration of aluminum in the second intermediate layer 6" is lower than the concentration of aluminum in the first intermediate layer 6'. In particular, the first intermediate layer 6', which extends in direct contact with the channel layer, is made of AlGaN with a concentration of aluminum comprised between 10% and 40%, for example 25%, whereas the second intermediate layer 6", which extends directly over the first intermediate layer 6', is made of AlGaN with a concentration of aluminum lower than the previous one, namely, comprised between 5% and 30%, for example 15%, or else with a profile of concentration of aluminum decreasing in the direction Z moving away from the first intermediate layer 6' (e.g., 30% of aluminum at the interface with the first intermediate layer 6' and 5% of aluminum at the front side 6a). The second intermediate layer 6" further includes silicon doped with N-type dopant species.

This conformation of the barrier layer 6 enables reduction of the barrier between the auxiliary channel 20 and the barrier layer 6.

During operation of the HEMT 1A, 1B, the charge carriers flow from the source region 10 to the drain region 12, following the conductive paths designated by $P_1$ and $P_2$ in FIG. 1. As may be noted, in the portion of active area comprised between the gate region 8 and the source region 10, the conductive paths $P_1$ and $P_2$ coincide; instead, in the portion of active area comprised between the gate region 8 and the drain region 12, the conductive paths $P_1$ and $P_2$ do not coincide. Here, part of the charge carriers flows towards the drain region 12 passing through the two-dimensional electron gas (2DEG) in the channel 4 (path $P_1$), whereas part of the charge carriers flows towards the drain region 12 passing through the two-dimensional electron gas (2DEG) in the channel 4, the barrier layer 6, and the auxiliary channel 20.

The choice, by the charge carriers, of the conductive path $P_1$ or $P_2$ is a function of the electrical resistance encountered in said path by the charge carriers.

In the case of undesired increase of the resistance Rory in the channel layer 4 (as a result of the known trapping phenomena) the conductive path $P_2$ is privileged over the conductive path $P_1$. In this way, during switching operating conditions of the HEMT 1A where, as a result of the traps in the channel layer 4, the resistance Rory increases, there always exists an alternative path for the current, i.e., the one offered by the auxiliary channel 20.

Operation of the HEMT device 1A is thus not inhibited by the traps in the channel layer 4.

The distance $d_1$ between the first side 8' of the gate region 8 and the auxiliary channel 20 guarantees that, at the operating voltages considered (e.g., 400 and 600 V), the electrical field at the gate region 8 is not of an excessively high value such as to break the gate oxide 8a.

Figure 3:
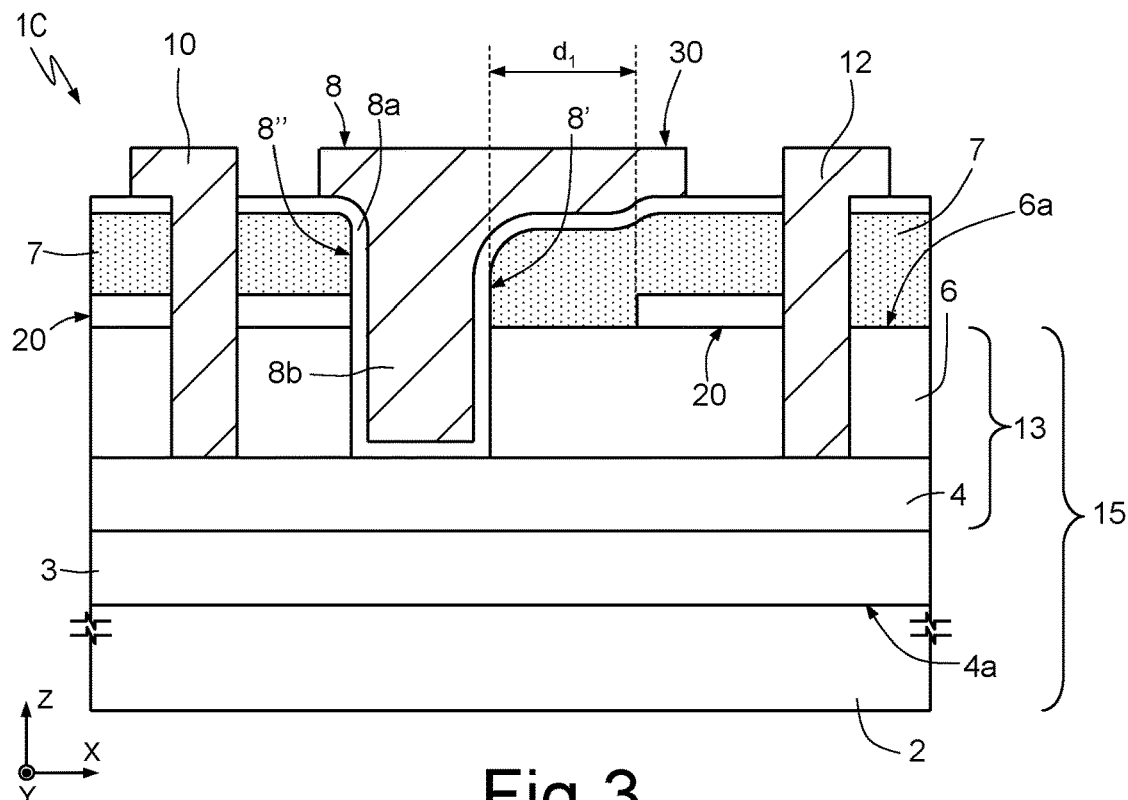
FIG. 3 shows, in lateral sectional view, an HEMT device according to a further embodiment of the present disclosure.

According to a further aspect of the present disclosure, illustrated in FIG. 3, an HEMT 1C (according to any of the embodiments of FIG. 1 or FIG. 2) further has a field-plate metal layer 30, which extends as prolongation of the gate metallization 8b towards the drain region 12 until it overlies (in top plan view or, equivalently, in the direction Z) the auxiliary channel 20. The auxiliary channel 20 and the field-plate metal layer 30 are separated from one another by the insulation layer 7 and, if present, the gate dielectric 8a.

Figure 4:
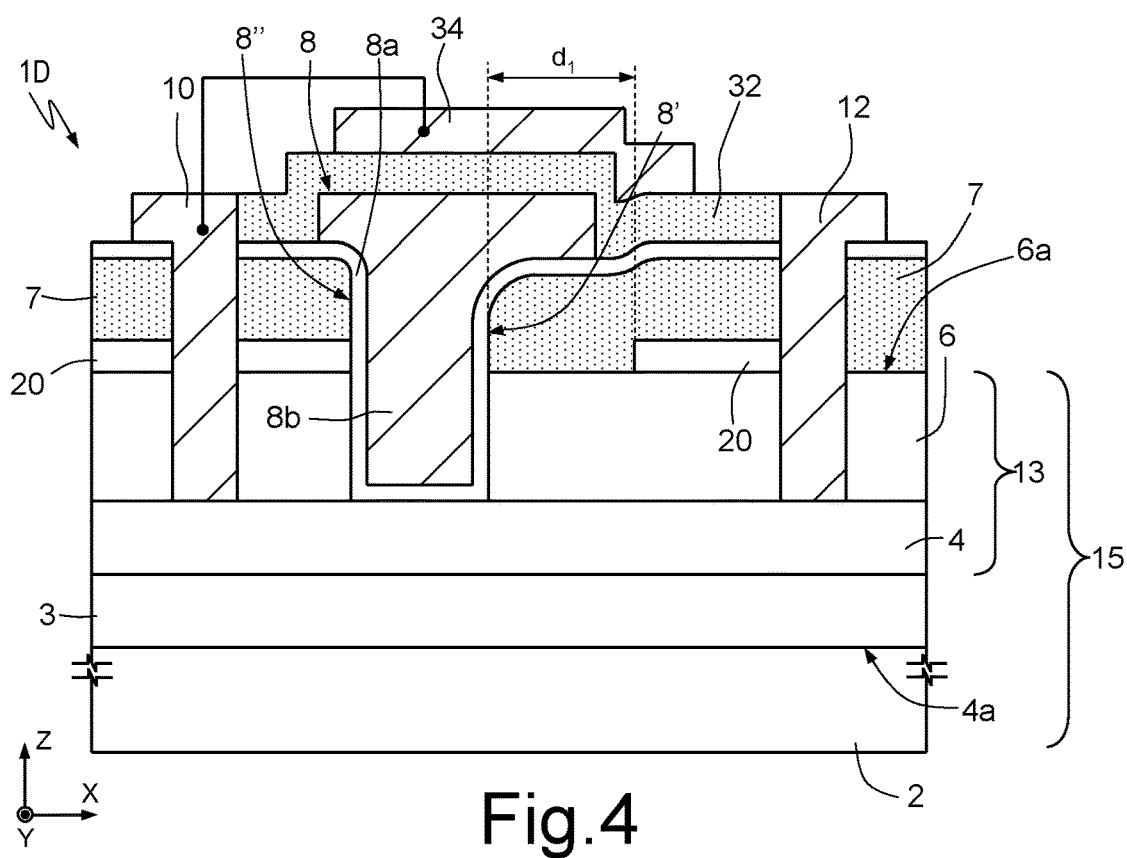
FIG. 4 shows, in lateral sectional view, an HEMT device according to a further embodiment of the present disclosure.
Figure 5:
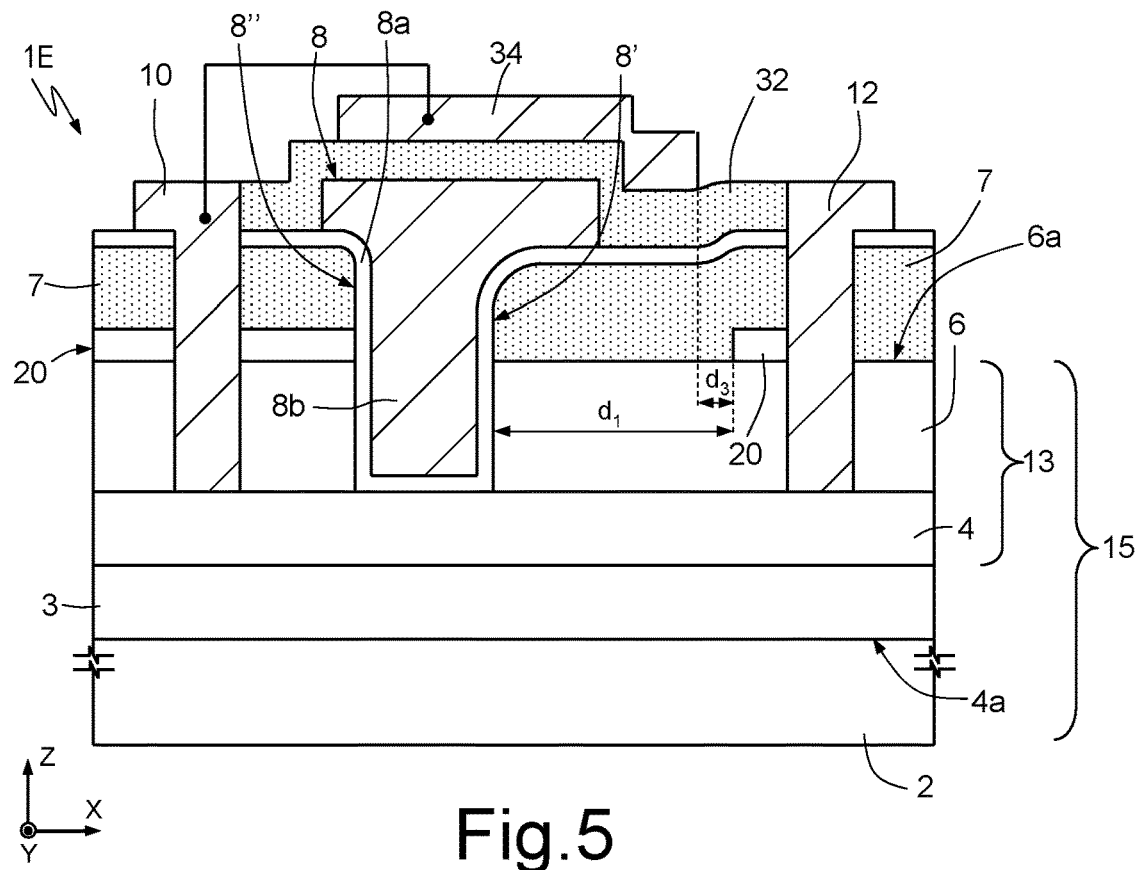
FIG. 5 shows, in lateral sectional view, an HEMT device according to a further embodiment of the present disclosure.

Alternatively to the HEMTs 1A, 1B, 1C with a field-plate metal layer 30 of a gate-connected type, there may be present one or more field plates of the source-connected type, i.e., electrically coupled to the metallization of the source region 10, in HEMTs 1D, 1E as illustrated in FIGS. 4 and 5, respectively (a source-connected field plate is identified by the reference number 34).

With reference to the HEMT 1D of FIG. 4, the field-plate metal layer 34 extends between the gate region 8 and the drain region 12 in parallel to the auxiliary channel 20, until it overlaps the latter (in top plan view or, equivalently, in the direction Z). The auxiliary channel 20 and the field-plate metal layer 34 are separated from one another by the insulation layer 7, by a passivation layer 32 and, if present, by the gate dielectric 8a. The passivation layer 32 has the function of insulating electrically the field-plate metal layer 34 from the gate region 8.

According to the HEMT 1E shown in FIG. 5, the auxiliary channel 20 extends laterally offset (in the direction X) with respect to the field-plate metal layer 34, i.e., not overlapping it (in the direction Z).

In this case, the maximum distance, measured in the direction X, between the edge that delimits the end of the field-plate metal layer 34 and the edge that defines the start of the auxiliary channel 20 is $d_3$ and has a value chosen so that there is not created a 2DEG region excessively depleted from the traps present in the buffer.

The value of $d_3$ is, in particular, equal to, or less than, 0.5 μm.

When both the gate field plate 30 and the source field plate 34 are present, the auxiliary channel 20 extends so that it is in at least one of the two conditions mentioned above with reference to FIGS. 3-4, i.e., that (i) the auxiliary channel 20 at least partially overlaps one between the gate field plate 30 and the source field plate 34; and/or (ii) the auxiliary channel 20 extends offset with respect to both the gate field plate and the source field plate 30, 34 and at a distance, measured in the direction X, not greater than $d_2$ or $d_3$ from at least one between the gate field plate 30 and the source field plate 34.

Described in what follows, with reference to FIGS. 6A-6E, are steps for manufacturing the HEMT device 1A of FIG. 1, although most of the same steps may be employed for manufacturing the HEMTs 1B-1E of FIGS. 2-5, with small modifications discussed below.

Figure 6A:
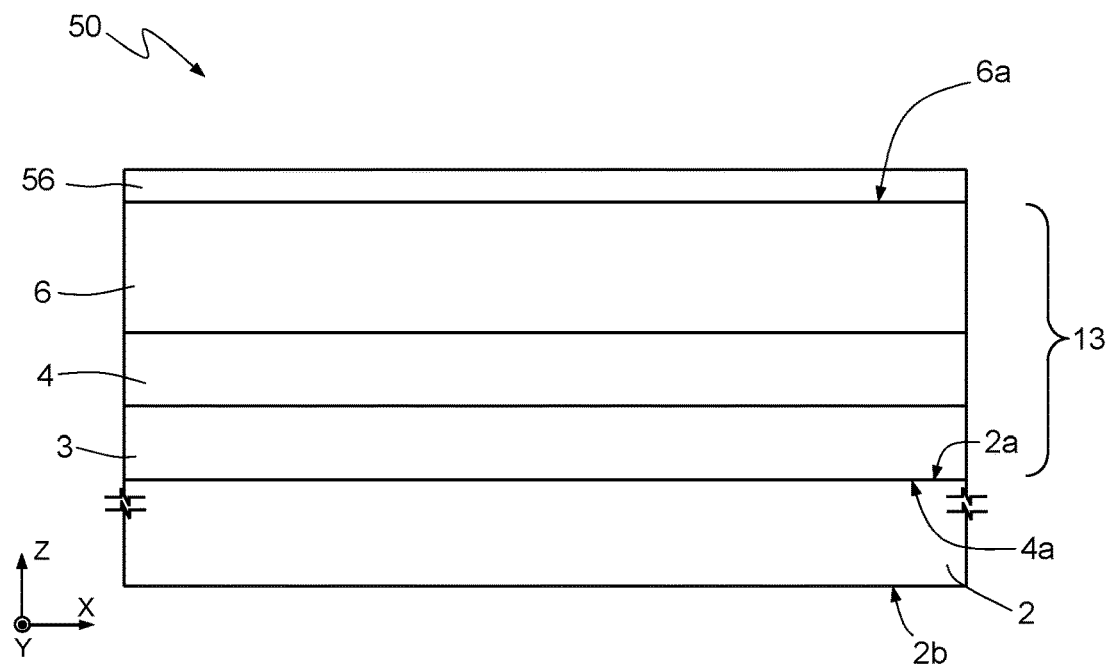
FIGS. 6A-6E show, in lateral sectional views, successive manufacturing steps of the HEMT device of FIG. 1.

FIG. 6A shows, in cross-sectional view, a portion of a wafer 50 during a step for manufacturing the HEMT device, according to one embodiment of the present disclosure. Elements of the wafer 50 that are common to the ones already described with reference to FIG. 1 and shown in FIG. 1, are designated by the same reference numbers and are not described in detail any further.

In particular, the wafer 50 is provided, comprising: the substrate 2, made, for example, of silicon (Si) or silicon carbide (SiC) or aluminum oxide ($Al_2O_3$), having a front side 2a and a rear side 2b opposite to one another in a direction Z; the buffer layer 3 on the front side 2a of the substrate 2, for example of aluminum gallium nitride (AlGaN) or of indium gallium nitride (InGaN); the channel layer 4, for example of gallium nitride (GaN), having its own underside 4a that extends adjacent to, and overlying, the buffer layer 3; and the barrier layer 6, which extends over the channel layer 4. The barrier layer 6 and the channel layer 4 form the heterostructure 13.

According to one or more embodiments of the present disclosure, formation of the barrier layer 6 envisages: formation of a first intermediate layer 6' on the channel layer by depositing AlGaN (e.g., via MOCVD or MBE) until a thickness is reached comprised between 5 nm and 20 nm, for example, 8 nm; and formation of a second intermediate layer 6" by depositing AlGaN and doped silicon with a doping level of $1 \cdot 10^{18}$ $cm^{-3}$ on the first intermediate layer 6', until a thickness comprised between 5 nm and 20 nm, for example 8 nm, is reached.

During deposition of the first intermediate layer 6', the concentration of aluminum is adjusted so that it is comprised between 10% and 40%; during deposition of the second intermediate layer 6", the concentration of aluminum is adjusted so that it is comprised between 50% and 30%.

Alternatively, the second intermediate layer 6" is formed so that it has a profile of concentration of aluminum decreasing in the direction Z moving away from the first intermediate layer 6' (e.g., 30% of aluminum at the interface with the first intermediate layer 6' and 5% of aluminum at the front side 6a).

Next, on the front side 6a of the barrier layer 6 an auxiliary channel layer 56 is formed, for example by depositing gallium nitride, GaN, with N-type doping (e.g., by MOCVD or MBE), according to the embodiment already described with reference to FIG. 1.

Alternatively, according to the embodiment of FIG. 2, the auxiliary channel layer 56 is formed by depositing a first layer of gallium nitride (GaN), of an intrinsic type and, then, over it, an AlGaN layer. Deposition of both the GaN layer and the AlGaN layer that form the auxiliary channel layer 56 is carried out by deposition (e.g., via MOCVD or MBE), modulating selectively the desired amount of aluminum in both layers.

Figure 6B:
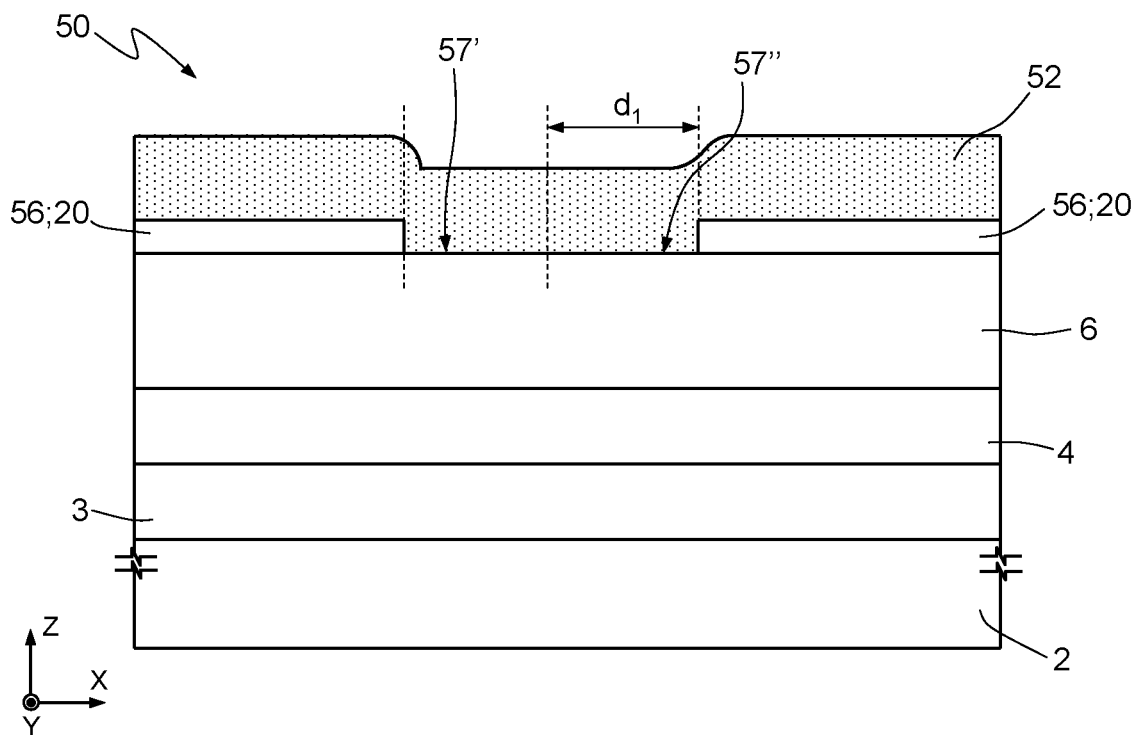
Figure 6C:
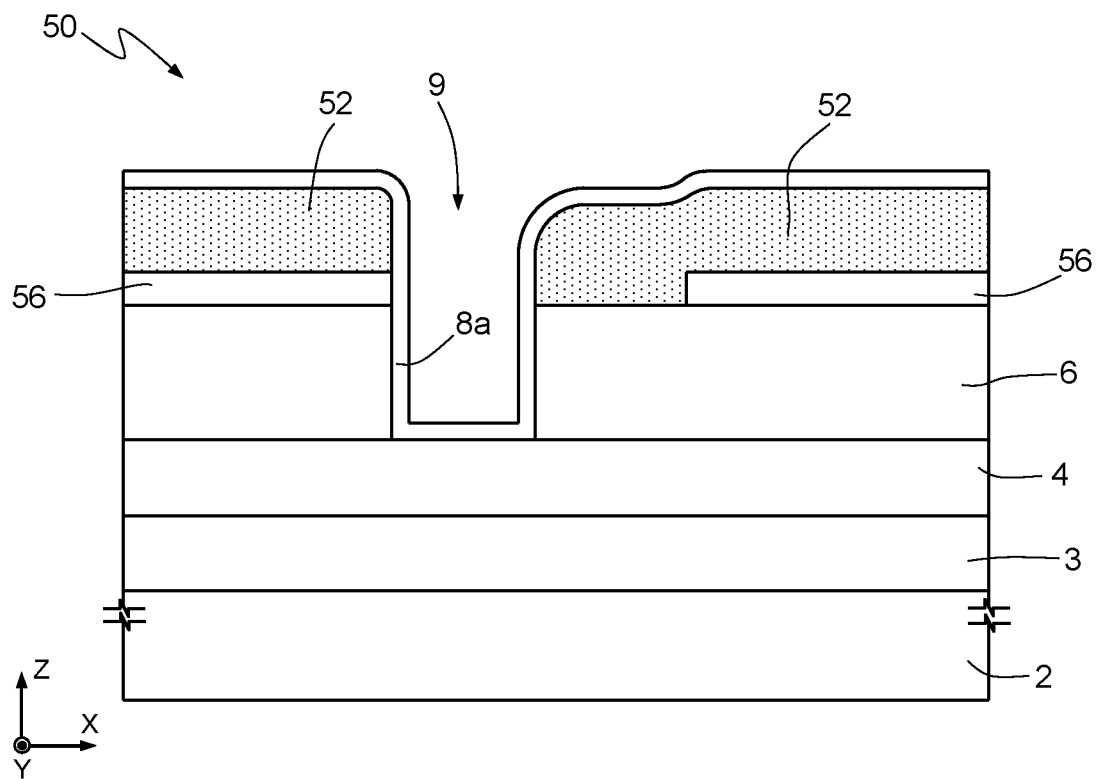
Figure 6D:
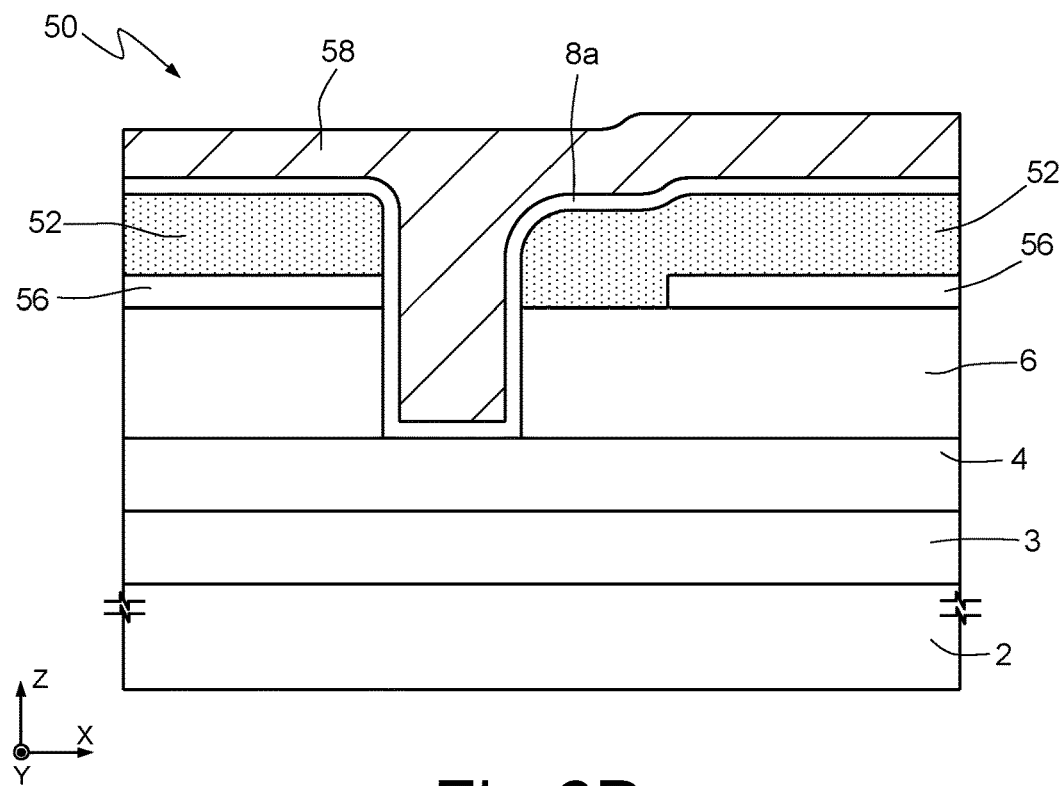
Figure 6E:
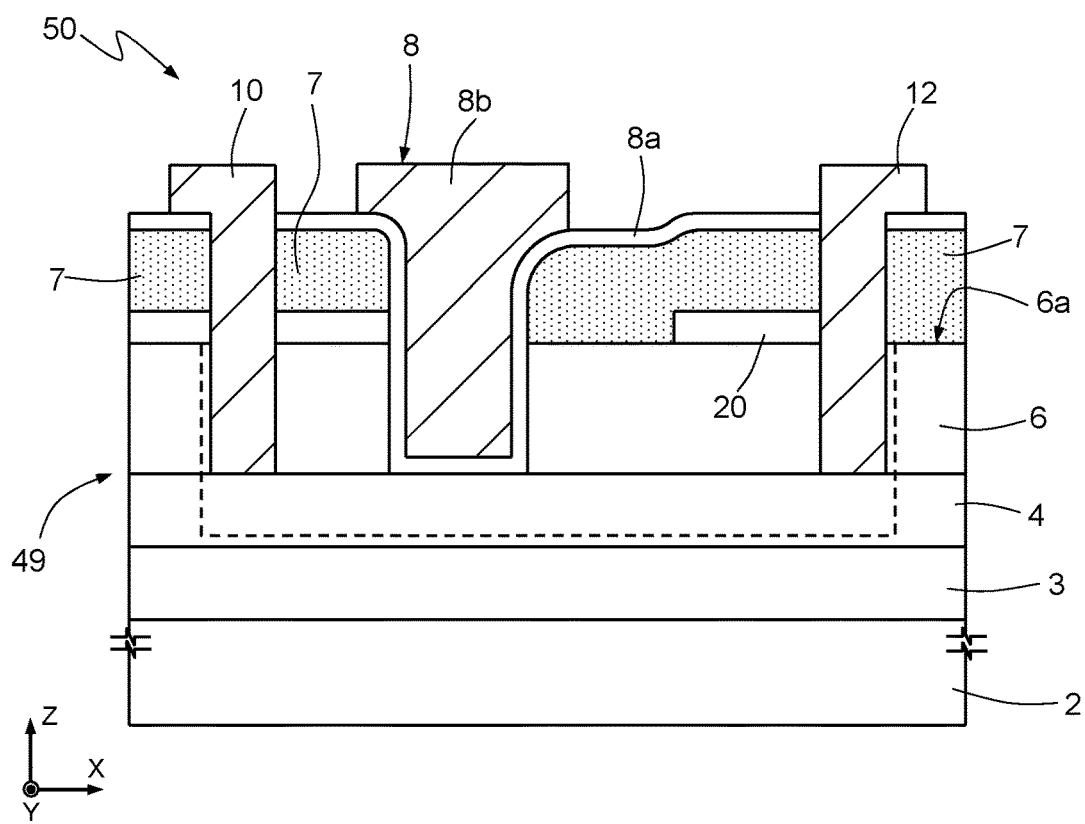

Then (FIG. 6B), a step of masked etching of the auxiliary channel layer 56 is carried out to remove first selective portions thereof at a region 57' where, in subsequent machining steps, the gate trench 9 will be formed, and to remove further second selective portions of the auxiliary channel layer 56 that extend alongside the region 57' for a length, in the direction X, equal to $d_1$ (region 57" identified in FIG. 6B). In particular, the removed second selective portions of the auxiliary channel layer 56 extend as lateral prolongation of the first selective regions, towards the portion of wafer 50 that will house the drain region of the HEMT device 1A-1E. This process step defines the distance $d_1$ between the drain region 8 and the auxiliary channel 20, as described previously.

Then, once again with reference to FIG. 6B, formed on the wafer 50 (and thus on the auxiliary channel layer 56 thus structured and at the regions 57', 57") is a passivation layer 52, of dielectric or insulating material, for example silicon nitride (SiN) or silicon oxide (SiO$_2$). The passivation layer 52 has a thickness comprised between 5 nm and 300 nm, for example 100 nm, and is formed by CVD or atomic-layer deposition (ALD), and, at the end of the manufacturing steps, will form the insulation layer 7.

Next (FIG. 6C), the passivation layer 52 is selectively removed, for example by lithographic and etching steps, for removing selective portions thereof in the region 57' of the wafer 50 where the gate region 8 of the HEMT device 1 is to be formed.

The etching step may stop at the underlying barrier layer 6 (to provide an HEMT of a normally-on type), or else it may proceed partially into the barrier layer 6 (the latter embodiment is shown in FIG. 6B). In this second case, a surface portion 4' of the underlying channel layer 4 is exposed. Etching of the barrier layer 6 is carried out, for example, by dry etching.

The trench 9 is thus formed, which extends throughout the thickness of the passivation layer 52 and for an underlying portion of the barrier layer 6.

There is then formed, for example by deposition, the gate-dielectric layer 8a, made, for example, of a material chosen from among aluminum nitride (AlN), silicon nitride (SiN), aluminum oxide (Al$_2$O$_3$), and silicon oxide (SiO$_2$). The gate-dielectric layer 8a has a thickness chosen between 1 and 50 nm, for example 20 nm.

Next (FIG. 6D), a step of deposition of conductive material on the wafer 30 is carried out to form a conductive layer 58 on the gate dielectric layer 8a, in particular in order to fill the trench 9. For example, the conductive layer 58 is made of metal material, such as tantalum (Ta), tantalum nitride (TaN), titanium nitride (TiN), palladium (Pa), tungsten (W), tungsten silicide (WSi$_2$), titanium/aluminum (Ti/Al), or nickel/gold (Ni/Au).

The conductive layer 58 is then selectively removed by lithographic and etching steps in themselves known for eliminating it from the wafer 50 except for the portion thereof that extends in the trench 9, thus forming the gate metallization 8b. During the same step, using an appropriate mask for etching of the conductive layer 58, it is further possible to define, in a per se known manner, the gate field plate 30, described with reference to FIG. 3.

The gate metallization 8b and the gate dielectric 8a form, as a whole, the recessed-gate region 8 of the HEMT device of FIG. 1.

Then (FIG. 6E), one or more further steps of masked etching of the gate dielectric 8a, of the passivation layer 52, of the auxiliary channel layer 56, and of the barrier layer 6 are carried out to remove selective portions thereof that extend in regions of the wafer 50 where the source and gate regions 10, 12 of the HEMT device 1A are to be formed.

Removal of the selective portions of the passivation layer 52 leads to formation of the insulation layer 7 illustrated in FIG. 1. Likewise, removal of selective portions of the auxiliary channel layer 56 leads to formation of the auxiliary channel 20 illustrated in FIG. 1.

In particular, openings are formed on opposite sides (sides 8' and 8") of the gate region 8, and at a distance from the gate region 8, until the channel layer 4 is reached.

Next, a step of formation of ohmic contacts is carried out to provide the source and drain regions 10, 12, by depositing conductive material, in particular metal such as titanium (Ti) or aluminum (Al), or alloys or compounds thereof, by sputtering or evaporation, on the wafer 50. A next step of etching of the metal layer thus deposited is then carried out to remove said metal layer from the wafer 50 except for the metal portions that extend within source and drain openings to form therein the source region 10 and the drain region 12, respectively.

Next, a step of rapid thermal annealing (RTA), for example at a temperature comprised between approximately 500 and 900° C. for a time of from 20 s to 5 min, enables formation of electrode ohmic contacts of the source electrode 10 and drain electrode 12 with the underlying channel layer (having the two-dimensional gas 2DEG).

The HEMT device 1A shown in FIG. 1 is thus formed.

Figure 7:
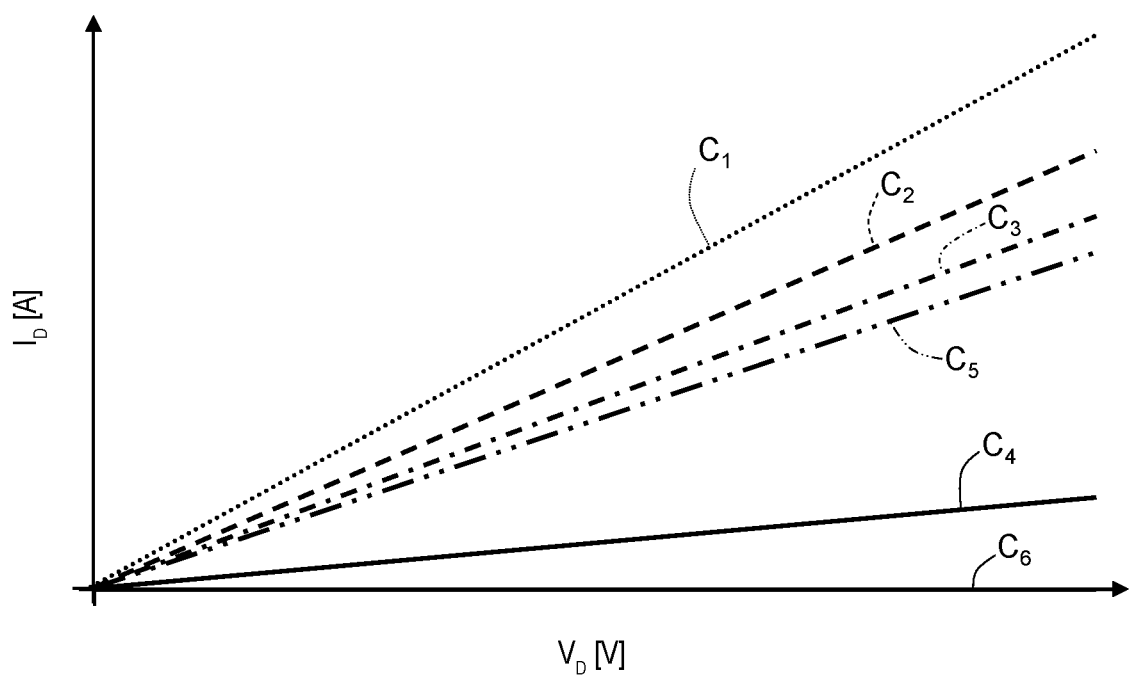
FIG. 7 shows the plot of the drain current of the HEMT device of FIG. 1 in different conditions of drain voltage, compared with an HEMT device according to the known art.

FIG. 7 represents the plot (obtained by simulation) of the drain current ($I_D$) (which is indicative of the ON-state resistance Rory) as a function of the drain stresses, for two biasing values provided by way of example (400 V and 600 V), and in both the case where the auxiliary channel is present according to the present disclosure and in the case where the auxiliary channel is absent according to the prior art. In particular, with reference to FIG. 7:

the curve $C_1$ shows the plot of the drain voltage VD as a function of the drain current in pre-stress conditions in an HEMT device provided with the auxiliary channel 20, according to the present disclosure;

the curve $C_2$ shows the plot of the drain voltage as a function of the drain current in pre-stress conditions in an HEMT device according to the known art, without of the auxiliary channel 20;

the curve $C_3$ represents the plot of the drain voltage as a function of the drain current in post-stress conditions (400 V) in an HEMT device provided with the auxiliary channel 20, according to the present disclosure;

the curve $C_4$ represents the plot of the drain voltage as a function of the drain current in post-stress conditions (400 V) in an HEMT device according to the known art, without the auxiliary channel 20;

the curve $C_5$ represents the plot of the drain voltage as a function of the drain current in post-stress conditions (600 V) in an HEMT device provided with the auxiliary channel 20, according to the present disclosure; and the curve $C_6$ represents the plot of the drain voltage as a function of the drain current in post-stress conditions (600 V) in an HEMT device according to the known art, without the auxiliary channel 20.

As may be noted, the presence of the auxiliary channel 20 (curves $C_1$, $C_3$, $C_5$) determines a marked increase in the drain current as compared to an embodiment that does not envisage it (curves $C_2$, $C_4$, $C_6$), in operating conditions comparable to one another.

Consequently, according to the present disclosure, the operating and functional characteristics of the HEMT device 1 are improved as compared to what is available according to the prior art.

An HEMT device provided according to the present disclosure shows high values of current irrespective of the operating conditions, and irrespective of the traps present in the channel layer (which does not require any specific optimization for reduction of the traps). The performance of the device is markedly improved.

Finally, it is clear that modifications and variations may be made to what is described and illustrated herein, without thereby departing from the scope of the present disclosure.

For example, according to further embodiments (not shown), the semiconductor body 5 may comprise just one or else more than one layers of GaN, or GaN alloys, appropriately doped or of an intrinsic type.

Further, according to one embodiment, the source region 10 and the drain region 12 extend in depth in the semiconductor body 5, completely through the barrier layer 6 and partially through the channel layer 4, and terminate within the channel layer 4.

Alternatively, the metallizations of the source and drain contacts may further be provided only partially recessed within the barrier layer 6, or else facing the front side 6a of the barrier layer 6.

The metallizations of the source, drain, and gate contacts may be made using any material designed for the purpose, such as, for example, formation of contacts of AlSiCu/Ti, Al/Ti, or W-plug, etc.

Further, according to one embodiment, the gate region 8 does not extend completely through the barrier layer 6, but terminates at the front side 6a of the barrier layer; in this case, the HEMT device is of a normally-on type.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
a semiconductor body including a first layer of a first III-V compound semiconductor material, a second layer of a second III-V compound semiconductor material over the first layer, and a third layer of a third III-V compound semiconductor material over the second layer;
a gate structure, which contacts the first layer in a first direction, contacts the second layer in a second direction that is different from the first direction, and is separated from a first portion of the third layer in the second direction, a distance between a gate electrode of the gate structure and the first portion of the third layer being substantially equal to or larger than 5 µm; and
a source structure that contacts the first layer in the first direction, contacts the second layer in the second direction, and contacts a second portion of the third layer in the second direction, wherein the second portion of the third layer contacts the gate structure in the second direction.

2. The device of claim 1, wherein the first III-V compound semiconductor material is GaN.

3. The device of claim 1, wherein the second III-V compound semiconductor material is one or more of a ternary of GaN or a quaternary alloys of GaN.

4. The device of claim 1, wherein the third III-V compound semiconductor material is GaN with an N-type doping.

5. The device of claim 1, wherein the second layer includes a first sub-layer and a second sub-layer positioned directly over the first sub-layer, a material of the first sub-layer and a material of the second sub-layer including same material elements with different element concentrations.

6. The device of claim 5, wherein the first sub-layer is AlGaNs of a first Al concentration, and the second sub-layer is AlGaNs of a second Al concentration, the second Al concentration being smaller than the first Al concentration.

7. The device of claim 1, wherein the first III-V compound semiconductor material and the second III-V compound semiconductor material have different band gaps.

8. The device of claim 1, wherein the gate structure includes a field plate that overlaps both the first layer and the second layer in the first direction, and is laterally offset from the first portion of the third layer in the second direction.

9. The device of claim 8, wherein the distance between the gate electrode and the first portion of the third layer in the second direction is larger than a dimension of the field plate extending from the gate electrode in the second direction.

10. The device of claim 1, further comprising a drain structure that contacts the first layer in the first direction, contacts the second layer in the second direction, and contacts the first portion of the third layer in the second direction.

11. A transistor, comprising:
a channel layer, which forms a main conductive channel,
a barrier layer over the channel layer;
an insulation layer over the barrier layer;
a gate including a gate electrode and a gate dielectric layer;
a drain electrode positioned by a first side of the gate, and contacting the channel layer;
a source electrode positioned by a second side of the gate, and contacting the channel layer;
an auxiliary channel layer extending over the barrier layer, in electrical contact with the drain electrode, and spaced apart from the gate electrode by the insulation layer; and
a gate field plate integral to the gate electrode and extending from the first side of the gate electrode over the insulation layer, and directly overlapping the gate dielectric layer.

12. The transistor of claim 11, wherein the auxiliary channel layer is spaced apart from first side of the gate electrode by a distance that is equal to, or greater than, 0.5 µm along said direction.

13. The transistor of claim 11, wherein the auxiliary channel layer is of gallium nitride with N-type doping.

14. The transistor of claim 11, wherein the auxiliary channel layer includes:
a first layer of GaN; and
a second layer of AlGaN positioned over the first layer, the second layer having an aluminum concentration ranging between 15% and 50%.

15. The transistor of claim 11, wherein:
the channel layer includes a first material;
the barrier layer includes a second material that has a different band gap from that of the first material.

16. The transistor of claim 11, wherein the barrier layer include:
a first intermediate layer of aluminum gallium nitride having an aluminum concentration ranging between 10% and 40%; and
a second intermediate layer, which extends over the first intermediate layer and includes aluminum gallium nitride having an aluminum concentration ranging between 5% and 30%.

17. A high-electron-mobility transistor (HEMT) device, comprising:
a main channel layer, which forms a main conductive channel;
a semiconductor barrier layer over the main channel layer;
an insulation layer over the semiconductor barrier layer;
a gate structure extending into the insulation layer, the gate structure including a gate electrode and a gate dielectric layer;
a drain electrode extending into the insulation layer and facing a first side of the gate structure;

a source electrode extending into the insulation layer and facing a second side of the gate structure that is opposite to the first side; and an auxiliary channel layer extending within the insulation layer and over the semiconductor barrier layer, the auxiliary channel layer being in electrical contact with the drain electrode, being separated from the gate structure by the insulation layer, and being coplanar with the insulation layer with respect to a top surface of the semiconductor barrier layer.

18. The HEMT device of claim 17, further comprising a gate field plate which contacts the gate electrode and extends over the insulation layer, the gate field plate being laterally offset from the auxiliary channel layer.

19. A high-electron-mobility transistor (HEMT) device, comprising:

a semiconductor body including a heterojunction structure that forms a main conductive channel of the HEMT device;

a dielectric layer on the semiconductor body;

a gate structure, a drain electrode, and a source electrode at least partially in the semiconductor body, the gate structure including a gate electrode and a gate dielectric layer, the gate dielectric layer extending over the dielectric layer, the drain electrode facing a first side of the gate electrode, and the source electrode facing a second side, opposite to the first side, of the gate electrode;

an auxiliary channel layer, which extends over the heterojunction structure between the gate electrode and the drain electrode, is in electrical contact with the drain electrode, is spaced apart from the first side of the gate electrode, and forms a conductive path additional to the main conductive channel for charge carriers to flow between the source electrode and the drain electrode; and a field plate integral to the gate electrode and extending from the first side of the gate electrode over the dielectric layer, and directly overlapping the gate dielectric layer.

20. The HEMT device of claim 19, further comprising a source field plate electrically coupled to the source electrode and overlapping the dielectric layer.

* * * * *

UNITED STATES PATENT AND TRADEMARK OFFICE
CERTIFICATE OF CORRECTION

PATENT NO. : 10,892,357 B2
APPLICATION NO. : 16/431642
DATED : January 12, 2021
INVENTOR(S) : Ferdinando Iucolano et al.

Page 1 of 1

It is certified that error appears in the above-identified patent and that said Letters Patent is hereby corrected as shown below:

In the Claims

Column 10, Line 35, Claim 12:
"μm along said direction" should read, -- μm --.

Signed and Sealed this
Twenty-third Day of February, 2021

Drew Hirshfeld
*Performing the Functions and Duties of the
Under Secretary of Commerce for Intellectual Property and
Director of the United States Patent and Trademark Office*